United States Patent
Chi

(10) Patent No.: US 9,665,137 B2
(45) Date of Patent: May 30, 2017

(54) HARD DISK FASTENING APPARATUS AND FASTENING MEMBER

(71) Applicant: HON HAI PRECISION INDUSTRY CO., LTD., New Taipei (TW)

(72) Inventor: Chang-Wen Chi, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 41 days.

(21) Appl. No.: 14/920,475

(22) Filed: Oct. 22, 2015

(65) Prior Publication Data

US 2017/0090527 A1 Mar. 30, 2017

(30) Foreign Application Priority Data

Sep. 29, 2015 (CN) .......................... 2015 1 0630711

(51) Int. Cl.
*G06F 1/18* (2006.01)
*F16B 5/02* (2006.01)
*H05K 7/12* (2006.01)

(52) U.S. Cl.
CPC ............ *G06F 1/187* (2013.01); *F16B 5/0208* (2013.01); *H05K 7/12* (2013.01)

(58) Field of Classification Search
CPC .................................................... F16B 5/0208
See application file for complete search history.

(56) References Cited

U.S. PATENT DOCUMENTS

| 8,622,673 | B2 * | 1/2014 | Wong | F16B 5/0266 411/347 |
|---|---|---|---|---|
| 8,920,089 | B1 * | 12/2014 | Stewart | F16B 5/0258 411/112 |
| 2003/0213876 | A1 * | 11/2003 | Takeuchi | F16B 21/02 248/71 |
| 2007/0012854 | A1 * | 1/2007 | Vaandrager | F16B 5/0208 248/674 |
| 2010/0040431 | A1 * | 2/2010 | Suzuki | F16B 5/0275 411/166 |
| 2010/0307997 | A1 * | 12/2010 | Lin | F16B 5/0208 211/183 |
| 2011/0038125 | A1 * | 2/2011 | Cao | H01L 23/4006 361/720 |
| 2011/0194910 | A1 * | 8/2011 | Lin | F16B 5/02 411/172 |
| 2011/0255935 | A1 * | 10/2011 | Chen | F16B 5/0208 411/347 |

(Continued)

*Primary Examiner* — Xanthia C Cunningham
(74) *Attorney, Agent, or Firm* — Steven Reiss

(57) ABSTRACT

A fastening member includes a columnar body and a buckling portion. The columnar body defines a threaded hole along the axial direction of the columnar body and a groove around the external surface of the columnar body along the radial direction of the columnar body. The groove divides the columnar body to a first restriction portion, a second restriction portion and a connection portion. The connection portion is surrounded by the groove. The first restriction portion and the second restriction portion are positioned at two ends of the groove. The buckling portion extends from the first restriction portion away from the first restriction portion. The disclosed subject matter also provides a hard disk fastening apparatus which fastens a hard disk using the fastening member.

15 Claims, 3 Drawing Sheets

(56) References Cited

U.S. PATENT DOCUMENTS

| | | | |
|---|---|---|---|
| 2011/0283480 A1* | 11/2011 | Chang | G06F 1/1681 |
| | | | 16/333 |
| 2013/0266394 A1* | 10/2013 | Reznar | B60R 13/0206 |
| | | | 411/122 |
| 2013/0343830 A1* | 12/2013 | Sauer | G06F 1/186 |
| | | | 411/204 |
| 2014/0366335 A1* | 12/2014 | Stothers | H05K 7/1489 |
| | | | 24/305 |
| 2015/0181726 A1* | 6/2015 | Li | F16B 5/02 |
| | | | 361/724 |
| 2015/0247517 A1* | 9/2015 | Tseng | F16B 21/02 |
| | | | 411/166 |
| 2015/0292539 A1* | 10/2015 | Tseng | F16B 5/0208 |
| | | | 411/132 |
| 2016/0073549 A1* | 3/2016 | Liu | H01L 23/4006 |
| | | | 248/231.61 |
| 2016/0242302 A1* | 8/2016 | Cox | H05K 5/0221 |
| 2016/0302322 A1* | 10/2016 | Chen | F16B 2/18 |

* cited by examiner

HARD DISK FASTENING APPARATUS AND FASTENING MEMBER

CROSS-REFERENCE TO RELATED APPLICATIONS

This application claims priority to Chinese Patent Application No. 201510630711.1, filed on Sep. 29, 2015, the contents of which are incorporated by reference herein.

FIELD

The subject matter herein relates to a hard disk fastening apparatus.

BACKGROUND

Hard disks having next generation form factor interfaces (NGFF Interface, also known as M.2 Interface) are installed to a transferring board with a stud and two nuts. The stud passes through the hard disk and the transfer board. The two nuts are positioned at two opposite sides of the transfer board and screwed to two ends of the stud to fix the hard disk to the transfer board.

BRIEF DESCRIPTION OF THE DRAWINGS

Implementations of the present technology will now be described, by way of example only, with reference to the attached figures.

DETAILED DESCRIPTION

Figure 1:
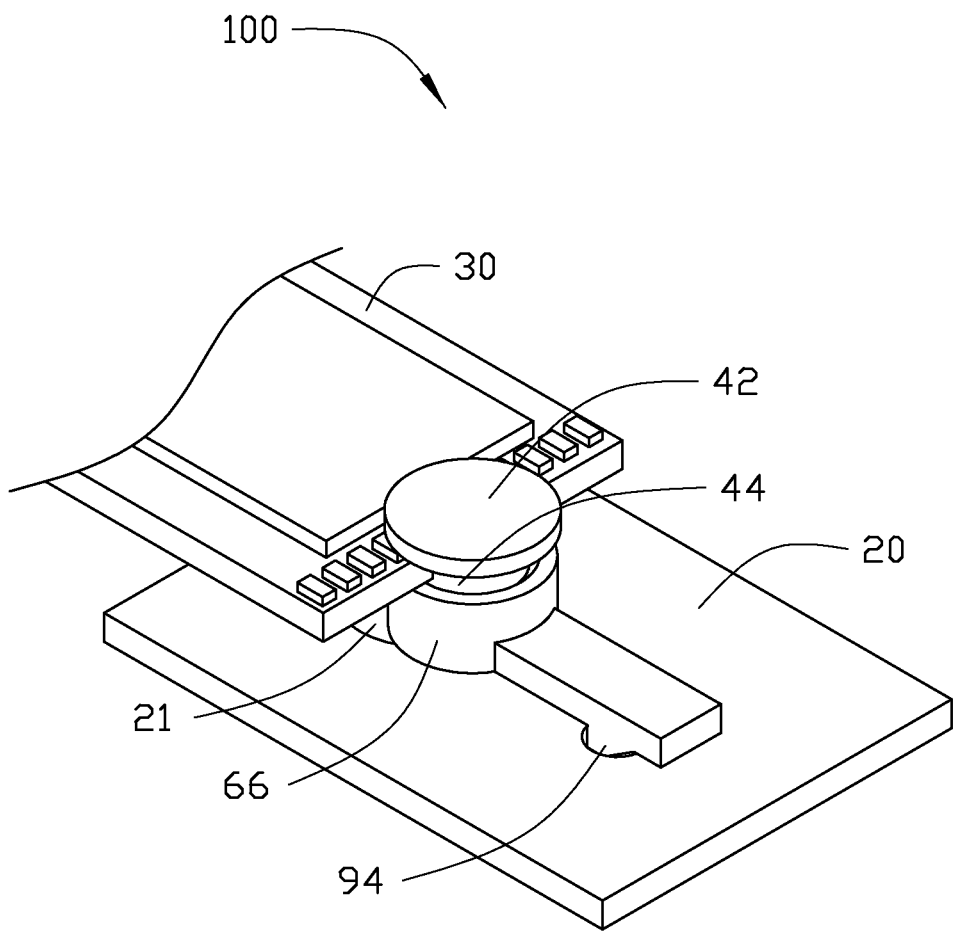
FIG. 1 is an isometric view of a hard disk fastening apparatus according to an embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "comprising" means "including, but not necessarily limited to"; it specifically indicates open-ended inclusion or membership in a so-described combination, group, series, and the like.

Figure 2:
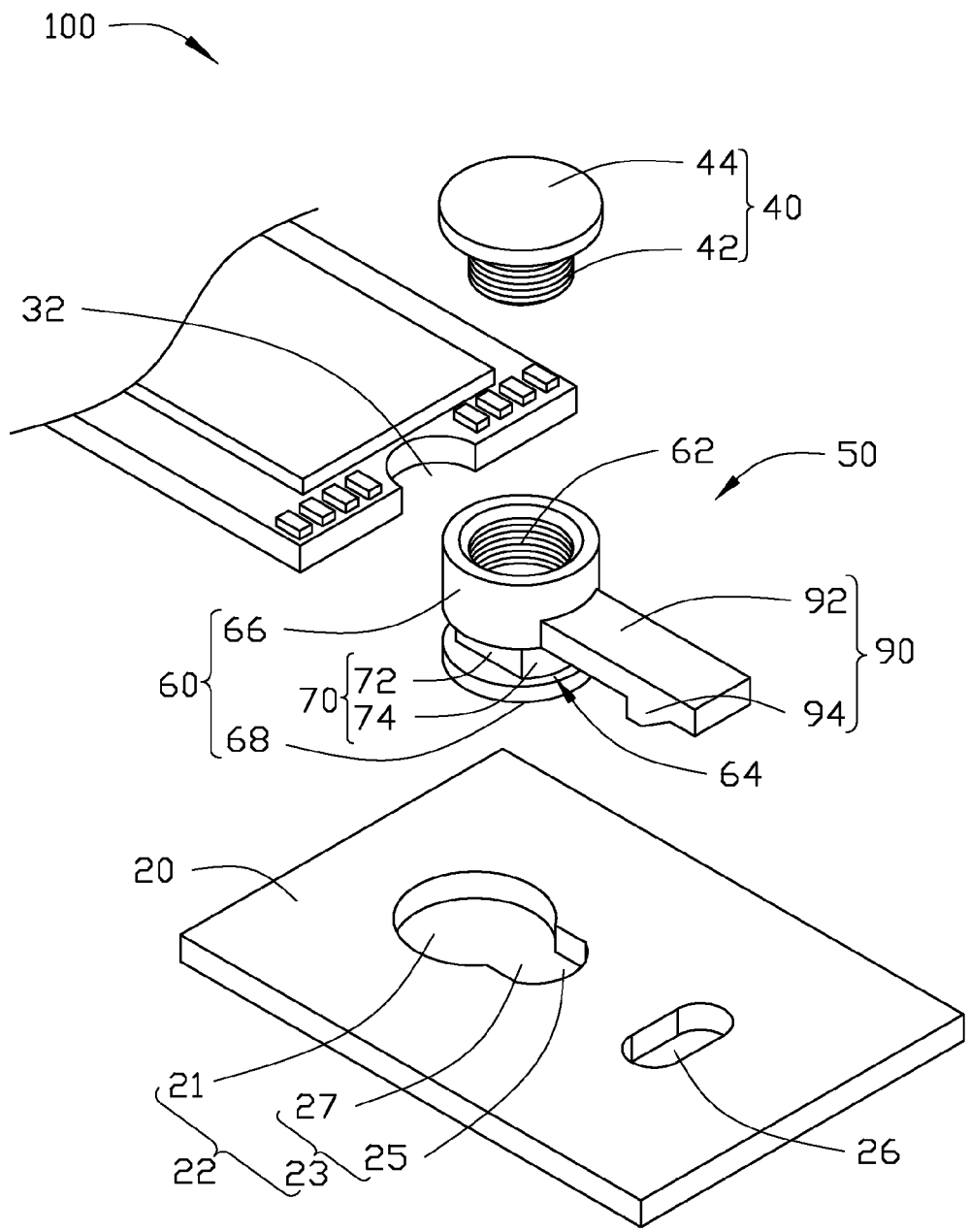
FIG. 2 is an exploded isometric view of the hard disk fastening apparatus of FIG. 1.

FIG. 1 illustrates a hard disk fastening apparatus 100. The hard disk fastening apparatus 100 includes a transfer board 20 and a hard disk 30 having a M.2 interface. FIG. 2 illustrates the hard disk fastening apparatus 100 further includes a screw 40 and a fastening member 50. The hard disk 20 is attached to the transfer board 30 with the screw 40 and the fastening member 50.

The transfer board 20 defines a fastening hole 22 and a locking hole 26. The fastening hole 22 includes a first arc through hole 21 and a restriction hole 23 communicating with the first arc through hole 21. The restriction hole 23 is positioned between the locking hole 26 and the first arc through hole 21.

The fastening member 50 includes a columnar body 60. The columnar body 60 defines a threaded hole 62 and a groove 64 around the external surface of the columnar body 60 along the radial direction of the columnar body 60. The groove 64 divides the columnar body 60 to a first restriction portion 66, a second restriction portion 68 and a connection portion 70. The connection portion 70 is surrounded by the groove 64. The first restriction portion 66 and the second restriction portion 68 are positioned at two ends of the groove 64. The outside diameter of the columnar body 60 is smaller than a size of the first arc through hole 21. Thus, the second restriction portion 68 can pass through the first arc through hole 21. The outside diameter of columnar body 60 is larger than a size of the restriction hole 23. A shape and a size of the connection portion 70 match a shape and a size of the restriction hole 23. Thus, when the second restriction portion 68 passes through the first arc through hole 21, the connection portion 70 can slide toward the restriction hole 23 to be received in the restriction hole 23. Therefore, the transfer board 20 is positioned between the first restriction portion 66 and the second restriction portion 68.

The restriction hole 23 includes a second arc through hole 25 and a connection hole 27. The connection hole 27 communicates with the first arc through hole 21 and the second arc through hole 25. The connection hole 27 is a rectangle. The connection portion 70 includes a cuboid 72 and an arc protruding portion 74 attached to a side of the cuboid 72. A size of the arc protruding portion 74 matches that of the second arc through hole 25 and is to be received in the second arc through hole 25. A size of the cuboid 72 matches that of the connection hole 27 to be received in the connection hole 27.

The fastening member 50 further includes a buckling portion 90. The buckling portion 90 extends from the first restriction portion 66 and is away from the first restriction portion 66. When the connection portion 70 is received in the restriction hole 23, the buckling portion 90 locks in the locking hole 26. Thus, the columnar body 60 is fixed in the restriction hole 23. The buckling portion 90 is elastic. When an external force is exerted on the buckling portion 90, the buckling portion 90 deforms to break away from the restriction hole 23. The buckling portion 90 includes an elastic arm 92 and a hook portion 94. The elastic arm 92 connects to the first restriction portion 66. The hook portion 94 extends from the elastic arm 92 toward the second restriction portion 68.

The hard disk 30 defines a semicircular opening 32. The hard disk 30 is positioned on the first restriction portion 66. The screw 40 includes a threaded pole 42 and a head 44. The threaded pole 42 passes through the opening 32 and screws in the threaded hole 62. A size of the head 44 is larger than that of the opening 32 to prevent the head 44 from passing through the opening 32. Thus, the hard disk 30 can be fixed between the head 44 and the first restriction portion 66.

Figure 3:
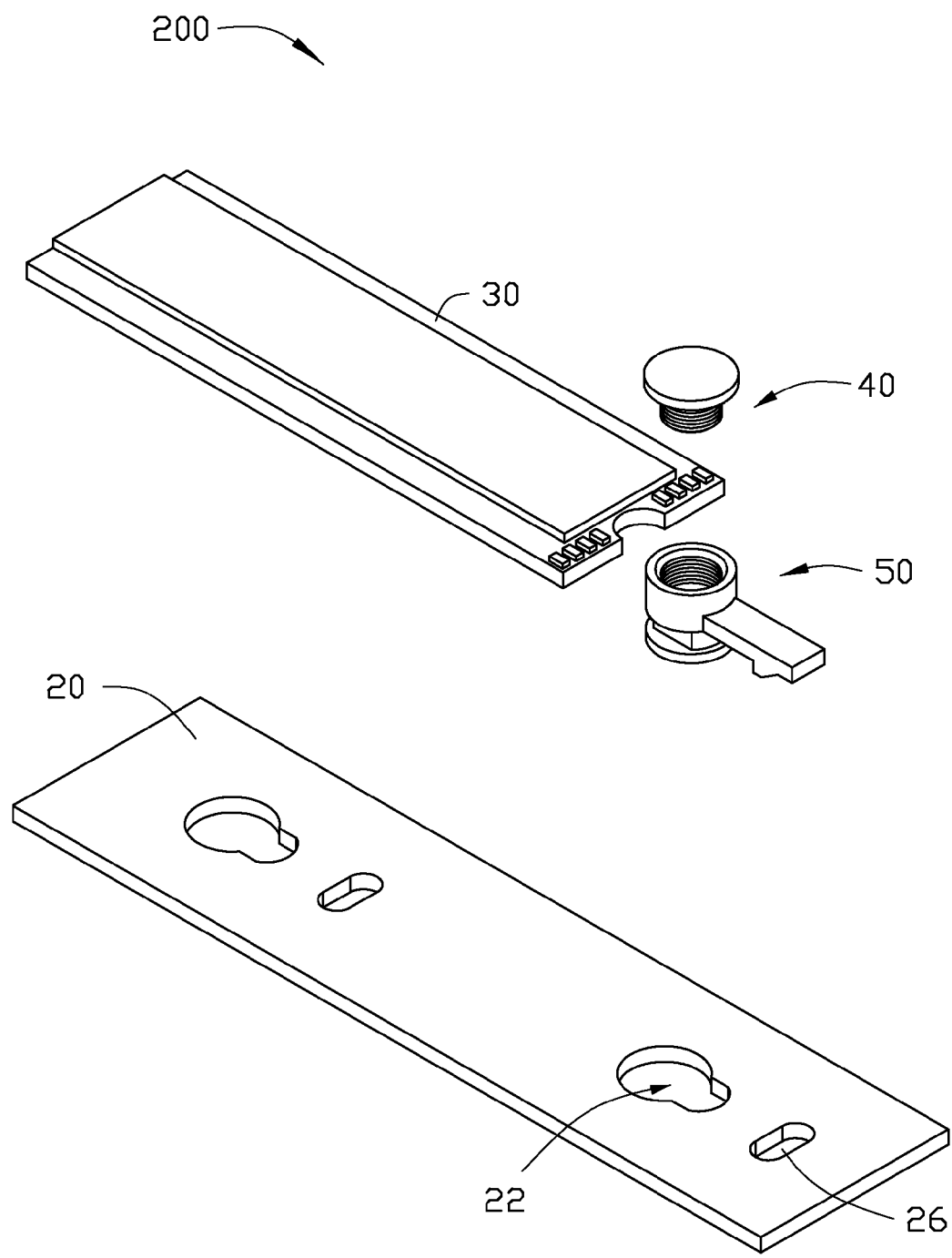
FIG. 3 is an exploded isometric view of a hard disk fastening apparatus according to another embodiment

FIG. 3 illustrates a hard disk fastening apparatus 200 according to another embodiment. The disk fastening apparatus 200 is similar to the disk fastening apparatus 100. A transfer board 20 defines a number of pairs of fastening holes 22 and locking holes 26. An operator can install the hard disk 30 at different positions.

The embodiments shown and described above are only examples. Even though numerous characteristics and advantages of the present technology have been set forth in the foregoing description, together with details of the structure and function of the present disclosure, the disclosure is illustrative only, and changes may be made in the details, including in matters of shape, size and arrangement of the parts within the principles of the present disclosure up to, and including, the full extent established by the broad general meaning of the terms used in the claims.

What is claimed is:

1. A fastening member comprising:
   a columnar body defining a threaded hole along the axial direction of the columnar body and a groove around the external surface of the columnar body along the radial direction of the columnar body, the groove dividing the columnar body to a first restriction portion, a second restriction portion and a connection portion, wherein the connection portion is surrounded by the groove, and the first restriction portion and the second restriction portion are positioned at two ends of the groove; and
   a buckling portion extending from the first restriction portion and being away the first restriction portion.

2. The fastening member as claimed in claim 1, wherein the connection portion comprises a cuboid and an arc protruding portion attached to a side of the cuboid.

3. The fastening member as claimed in claim 1, wherein the buckling portion is elastic.

4. The fastening member as claimed in claim 3, wherein the buckling portion comprises an elastic arm and a hook portion, the elastic arm connects to the first restriction portion, the hook portion extends from the elastic arm toward the second restriction portion.

5. A hard disk fastening apparatus comprising:
   a transfer board defining a fastening hole and a locking hole, the fastening hole comprises a first arc through hole and a restriction hole communicating with the first arc through hole;
   a fastening member comprising:
      a columnar body defining a threaded hole along the axial direction of the columnar body and a groove around the external surface of the columnar body along the radial direction of the columnar body, the groove dividing the columnar body to a first restriction portion, a second restriction portion and a connection portion, the outside diameter of the columnar body being smaller than a size of the first arc through hole and being larger than a size of the restriction hole, the connection portion received in the restriction hole, the transfer board positioned between the first restriction portion and the second restriction portion; and
      a buckling portion locked in the locking hole;
   a hard disk positioned on the first restriction portion; and
   a screw comprising a threaded pole and a head, the threaded pole screwed in the threaded hole, the head positioned on the hard disk.

6. The hard disk fastening apparatus as claimed in claim 5, wherein the connection portion comprises a cuboid and an arc protruding portion attached to a side of the cuboid.

7. The hard disk fastening apparatus as claimed in claim 6, wherein the restriction hole comprises a second arc through hole and a connection hole, the connection hole communicates with the first arc through hole and the second arc through hole.

8. The hard disk fastening apparatus as claimed in claim 5, wherein the buckling portion is elastic.

9. The hard disk fastening apparatus as claimed in claim 8, wherein the buckling portion comprises an elastic arm and a hook portion, the elastic arm connects to the first restriction portion, the hook portion extends from the elastic arm toward the second restriction portion.

10. A hard disk fastening apparatus comprising:
    a transfer board defining a fastening hole and a locking hole, the fastening hole comprises a first arc through hole and a restriction hole communicating with the first arc through hole;
    a fastening member comprising:
       a columnar body defining a threaded hole along the axial direction of the columnar body and a groove around the external surface of the columnar body along the radial direction of the columnar body, the groove dividing the columnar body to a first restriction portion, a second restriction portion and a connection portion, the connection portion movable between the first arc through hole and the restriction hole, when the connection portion is received in the restriction hole, the transfer board abuts between the first restriction portion and the second restriction portion; and
       a buckling portion locked in the locking hole;
    a hard disk positioned on the first restriction portion; and
    a screw comprising a threaded pole and a head, the threaded pole screwed in the threaded hole, the head positioned on the hard disk.

11. The hard disk fastening apparatus as claimed in claim 10, wherein the outside diameter of the columnar body is smaller than a size of the first arc through hole and is larger than a size of the restriction hole.

12. The hard disk fastening apparatus as claimed in claim 10, wherein the connection portion comprises a cuboid and an arc protruding portion attached to a side of the cuboid.

13. The hard disk fastening apparatus as claimed in claim 12, wherein the restriction hole comprises a second arc through hole and a connection hole, the connection hole communicates with the first arc through hole and the second arc through hole.

14. The hard disk fastening apparatus as claimed in claim 10, wherein the buckling portion is elastic.

15. The hard disk fastening apparatus as claimed in claim 14, wherein the buckling portion comprises an elastic arm and a hook portion, the elastic arm connects to the first restriction portion, the hook portion extends from the elastic arm toward the second restriction portion.

* * * * *